United States Patent [19]

Nakajima et al.

[11] Patent Number: 4,953,171

[45] Date of Patent: Aug. 28, 1990

[54] SEMICONDUCTOR LASER SOURCE UNIT

[75] Inventors: Tomohiro Nakajima, Matsudo; Kazuyuki Shimada, Chofu; Nobuo Sakuma, Inagi; Seizoh Suzuki, Tokyo; Katsumi Yamaguchi, Fuchu, all of Japan

[73] Assignee: Ricoh Company, Ltd., Tokyo, Japan

[21] Appl. No.: 350,598

[22] Filed: May 11, 1989

[30] Foreign Application Priority Data

Jun. 3, 1988 [JP] Japan ................. 63-136777

[51] Int. Cl.$^5$ ............................................. H01S 3/19
[52] U.S. Cl. ............................................. 372/44; 357/74
[58] Field of Search ............................. 357/74; 372/44

[56] References Cited

U.S. PATENT DOCUMENTS

| | | | |
|---|---|---|---|
| 4,186,995 | 2/1980 | Schumacher | 357/74 |
| 4,295,152 | 10/1981 | Khoe et al. | 357/74 |
| 4,307,934 | 12/1981 | Palmer | 357/74 |
| 4,351,051 | 9/1982 | van Alem et al. | 357/74 |
| 4,403,243 | 9/1983 | Hakamada | 357/74 |
| 4,686,678 | 8/1987 | Ohta et al. | 357/74 |
| 4,752,109 | 6/1988 | Gordon et al. | 357/74 |
| 4,763,334 | 8/1988 | Shimada et al. | 372/29 |

Primary Examiner—William L. Sikes
Assistant Examiner—Robert E. Wise
Attorney, Agent, or Firm—Cooper & Dunham

[57] ABSTRACT

A semiconductor laser source unit includes a semiconductor laser chip emitting a laser beam, a base member supporting the semiconductor laser chip, and a protection cover mounted on the base member so as to seal the semiconductor laser chip. The protection cover has a lid portion formed at an end thereof and an opening at an opposed end thereof facing the base member. The lid portion has a window. The semiconductor laser source unit also has a single aspherical lens fastened to the lid portion of the protection cover so as to cover the window formed in the lid portion. The single aspherical lens collimates the laser beam emitted from the semiconductor laser chip.

23 Claims, 6 Drawing Sheets

FIG.3
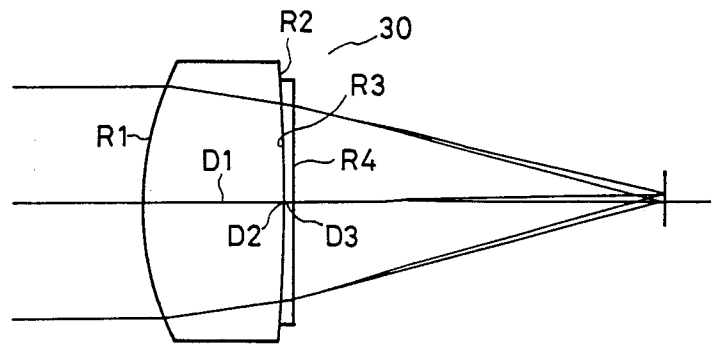
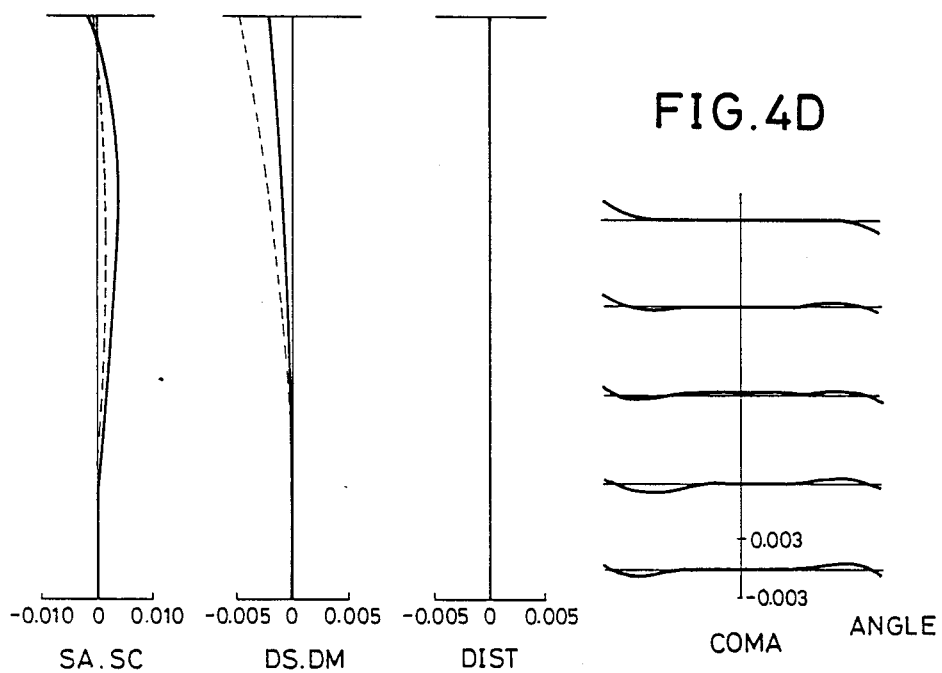

FIG. 5
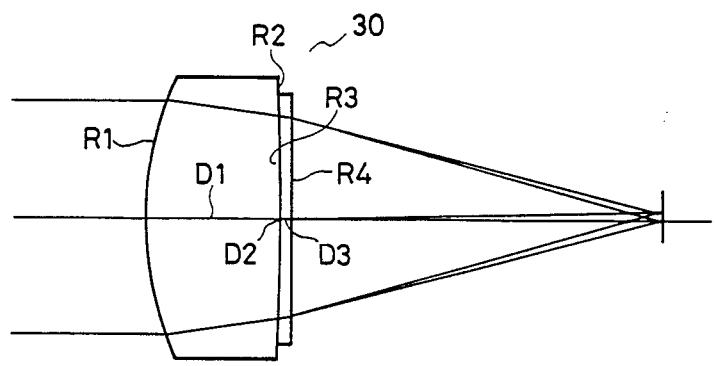
FIG.6A  FIG.6B  FIG.6C
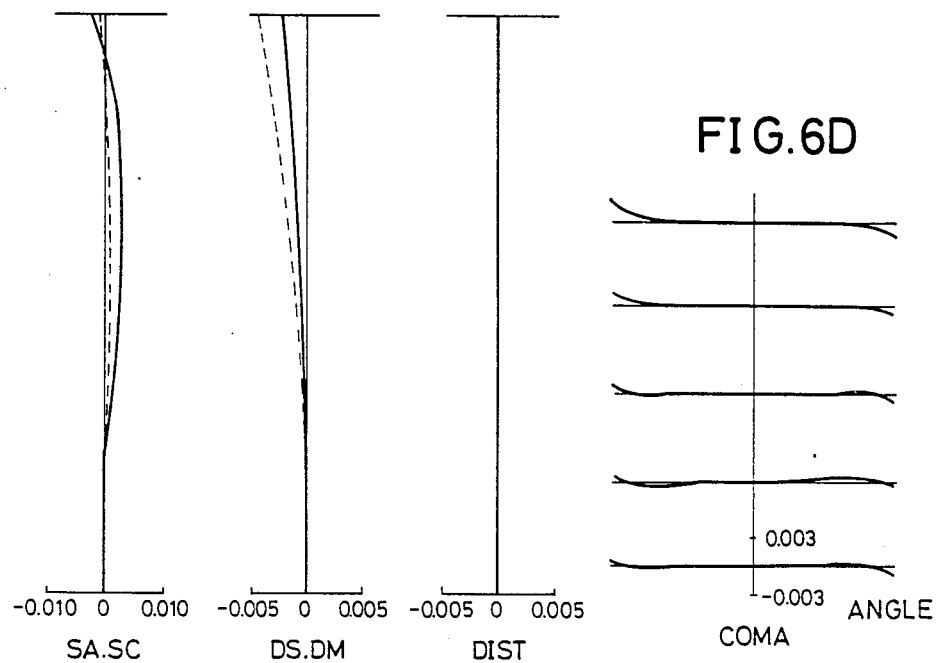
FIG.6D

FIG. 7
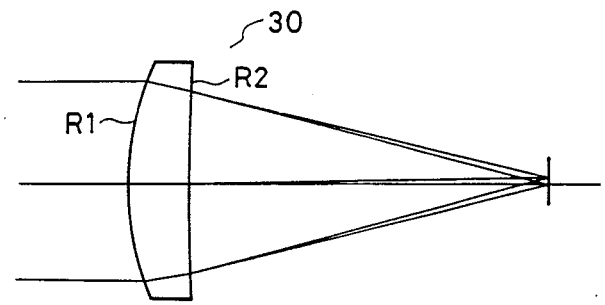
FIG. 8A  FIG. 8B  FIG. 8C
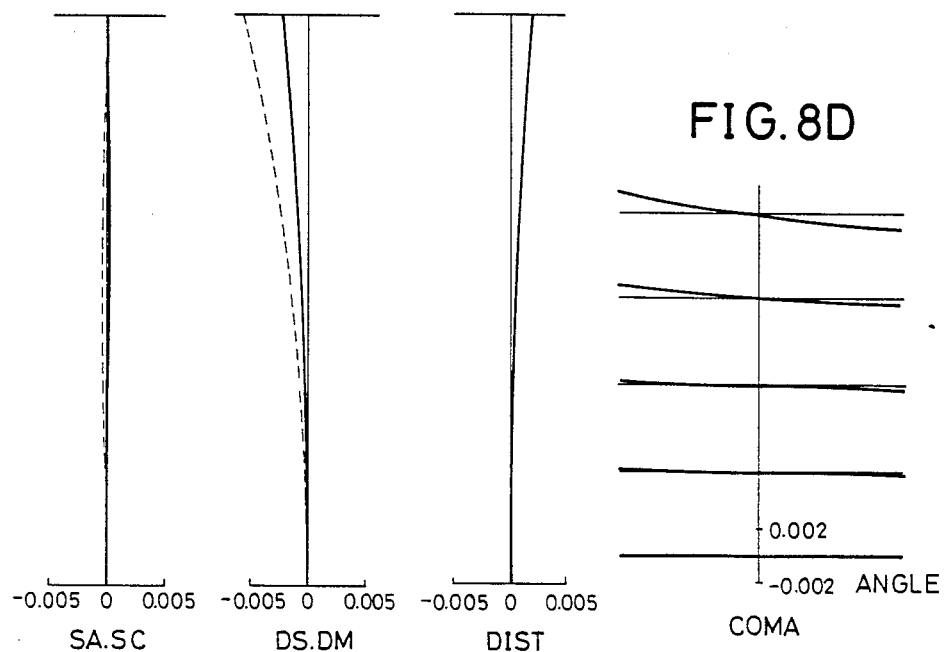
FIG. 8D

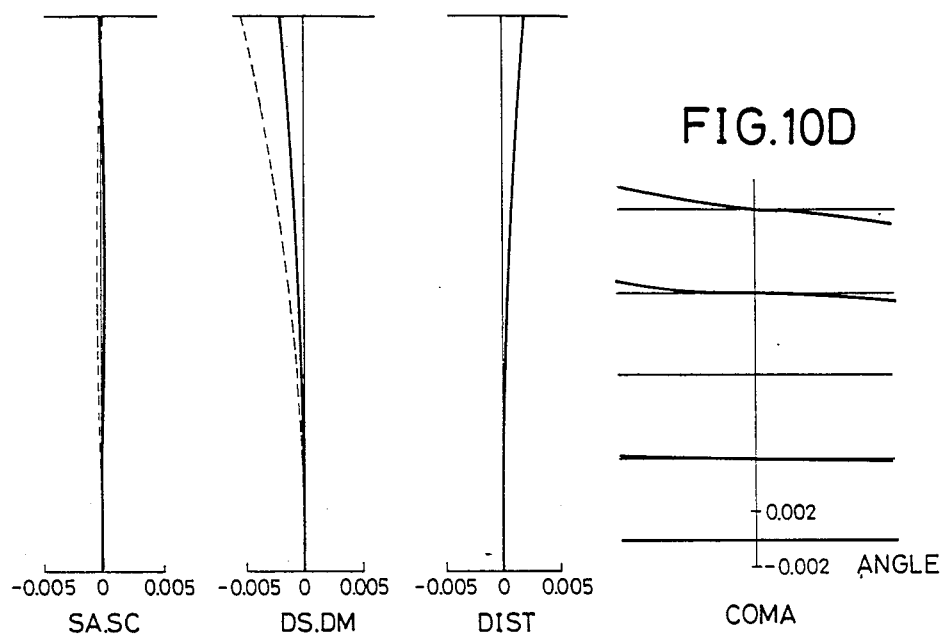
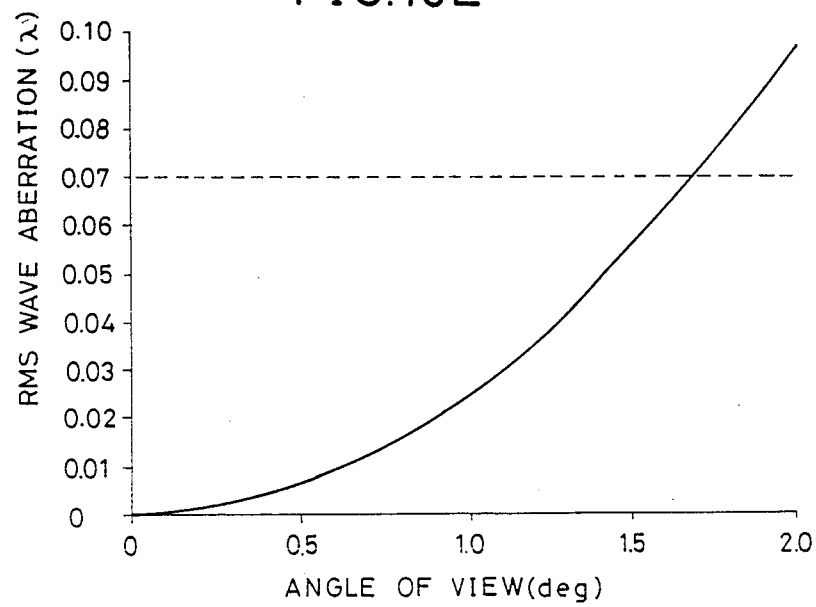

SEMICONDUCTOR LASER SOURCE UNIT

BACKGROUND OF THE INVENTION

A present invention generally relates to a semiconductor laser source unit, and particularly to a semiconductor laser source unit suitable for an optical system having a light source such as a facsimile machine, a laser printer, and a copier.

Currently, a semiconductor laser is widely used as a light source for an optical system. As is well known, a laser beam emitted from a semiconductor laser unit is a divergent light. For this reason, generally, a packaged semiconductor laser unit including a semiconductor laser diode or chip is combined with a collimating lens so as to construct a semiconductor laser source unit, which emits a collimated laser beam.

A conventional semiconductor laser source unit is disclosed in U.S. Pat. No. 4,763,334. The disclosed semiconductor laser source unit includes a semiconductor laser unit supported by a metal support plate, and a collimating lens which consists of a plurality of lenses and is supported by the metal support plate so as to be placed in position for receiving a laser beam emitted from the semiconductor laser unit and collimating it. The above-mentioned structural parts are covered by an electrically insulating cover so as to construct a unit of a semiconductor laser source. As is well known, it is required to position the semiconductor laser unit and the collimating lens with extremely high precision. For this reason, the collimating lens is movably fastened to the metal support plate so that the position of the collimating lens can be adjusted in X and Y directions.

However, the adjustment of position of the collimating lens is very troublesome. Additionally, the size of the semiconductor laser source unit is large, because the metal support plate must be used to support the semiconductor laser unit and the collimating lens consisting of a plurality of lenses.

A single aspherical lens is disclosed in Japanese Laid-Open Patent Application Nos. 57-201210 and 58-17409. The disclosed aspherical lens is used as an objective lens in an optical pick-up. The aspherical lens and a recording disc having recording track formed on a surface thereof, for example, are provided so as to be relatively movable.

One may conceive that the disclosed single aspherical lens is substituted for the collimating lens of the semiconductor laser source unit disclosed in U.S. Pat. No. 4,763,334. The use of a single aspherical lens would contribute to reducing the working of adjusting the lens position. However, even by the above-mentioned conceivable combination, it is impossible to extremely reduce the size of the semiconductor laser source unit.

SUMMARY OF THE INVENTION

It is therefore an object of the present invention to provide a semiconductor laser source unit in which the above-mentioned disadvantages are eliminated.

A more specific object of the present invention is to provide a semiconductor laser source unit of a reduced size and simple structure.

The above objects of the present invention can be achieved by a semiconductor laser source unit comprising a semiconductor laser chip emitting a laser beam, a base member supporting the semiconductor laser chip, and a protection cover mounted on the base member so as to cover the semiconductor laser chip. The protection cover has a lid portion formed at an end thereof and an opening formed at an opposed end thereof facing the base member. The lid portion has a window. The semiconductor laser source unit also has a single aspherical lens fastened to the lid portion of the protection cover so as to cover the window formed in the lid portion. The single aspherical lens collimates the laser beam emitted from the semiconductor laser chip.

Other objects, features and advantages of the present invention will become apparent from the detailed description when read in conjunction with the accompanying drawings.

BRIEF DESCRIPTION OF THE DRAWINGS

FIG. 3 is a view of a first example of a glass collimating lens used in the embodiment;

FIGS. 4A, 4B, 4C, and 4D are graphs illustrating optical characteristics of the first example shown in FIG. 3;

FIG. 5 is a view of a second example of the glass collimating lens used in the embodiment;

FIGS. 6A, 6b, 6C, and 6D are graphs illustrating optical characteristics of the second example shown in FIG. 5;

FIG. 7 is a view of a third example of the glass collimating lens used in the embodiment;

FIGS. 8A, 8B, 8C, 8D, and 8E are graphs illustrating optical characteristics of the third example shown in FIG. 7;

FIGS. 10A, 10B, 10C, 10D, and 10E are graphs illustrating optical characteristics of the fourth example.

DESCRIPTION OF THE PREFERRED EMBODIMENTS

Figure 1:
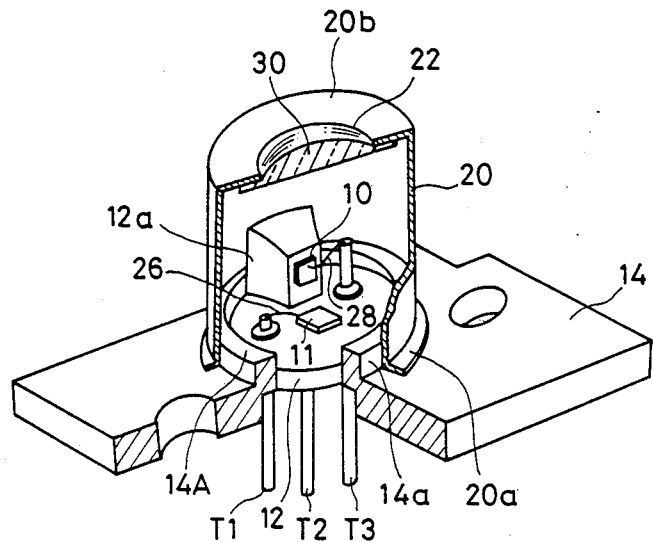
FIG. 1 is a perspective view of a preferred embodiment of the present invention.

A description is given of a preferred embodiment of the present invention. Referring to FIG. 1, there is illustrated a semiconductor laser source unit of the embodiment of the present invention. The illustrated semiconductor laser source unit includes a semiconductor laser chip 10, a protection cover 20, and a glass lens 30. As will be described in detail later, the glass collimating lens 30 consists of a single aspherical lens, or a combination with a glass cover used for protecting the semiconductor laser chip 10 from dust or the like. The semiconductor laser chip 10 is mounted on a supporting member 12a, which is mounted on a disc-shaped stem 12. The supporting member 12a is also served as a heat sink. The semiconductor laser chip 10 emits a single laser beam forward, or toward the glass collimating lens 30. The semiconductor laser chip 10 also emits a laser beam backward. It is possible to use a semiconductor laser chip which emits two or more laser beams forward. The stem 12, which is also served as a heat sink, is press-fitted into a circular opening formed in a heat sink 14. That is, the diameter of the stem 12 is slightly larger than that of the opening formed in the heat sink 14. A ring-shaped projection 14a, which is integrally formed with the heat sink 14, is formed around the opening of the heat sink 14.

The protection cover 20 is a member in the shape of a hollow cylinder, and has a flange portion 20a formed at an end thereof. The protection cover 20 is fastened to the heat sink 14 by press-fitting the ring-shaped projection 14a of the heat sink 14 into an inner wall portion at the end of the protection cover 20 where the flange portion 20a is formed. At an end of the protection cover 20 opposite to the end having the flange portion 20a, there is formed a lid portion 20b having a laser beam emitting window (hereinafter simply referred to as a window) 22 located at the center thereof.

The glass collimating lens 30 is fastened to the lid portion 20b of the protection cover 20 so as to seal the window 22. A lens surface of the glass collimating lens 30 having a smaller radius of curvature (or a larger curvature) is exposed outside. A circumferential end portion of the glass collimating lens 30 makes contact with and is fixed to an inner surface of the lid portion 20b of the protection cover 20 by an adhesive, for example. It is necessary to position the glass collimating lens 30 with respect to a light emitting portion of the semiconductor laser chip 10. However, it is not required to position, with high accuracy, the glass collimating lens 30 in the direction orthogonal to the optical axis thereof with respect to the light emitting portion of the semiconductor laser chip 10, because the glass collimating lens 30 is a single aspherical lens. It is possible to position the glass collimating lens 30 in the direction of the optical axis by adjusting the press-fitting state of the protection cover 20 and the heat sink 14 and/or the press-fitting state of the stem 12 and the heat sink 14. It is also noted that the glass collimating lens 30 is also served as a glass cover having the function of protecting the semiconductor laser chip 10 from dust or the like.

A photoelectric conversion element or light receiving element 11 is formed on the stem 12 so as to receive the laser beam emitted backward from the semiconductor laser chip 10. A signal line 26 is provided between the light receiving element 11 and a terminal T1, which penetrates the stem 12. The light receiving element 11 is also coupled to a terminal T2 set to ground level. A signal derived from the light receiving element 11 is extracted through the terminals T1 and T2. A signal line 28 is provided between the semiconductor laser chip 10 and a terminal T3. A driving signal supplied from an external device is supplied to the semiconductor laser chip 10 through the terminals T2 and T3. In this manner, the terminal T2 functions as a common electrode.

It is preferable to select a material of the protection cover 20 so as to cancel an increase (decrease) of the focal distance of the glass collimating lens 30 by an expansion (contraction) of the protection cover 20. That is, a material of the protection cover 20 is selected so as to select a value $\alpha$ of the linear expansion coefficient for the protection cover 20 so as to make the following formula zero:

$$\alpha - [(1/f)(d\lambda/dT)(df/d\lambda)]$$

where f is the focal distance of the glass collimating lens 30, $\lambda$ is the wavelength of the laser beam emitted from the semiconductor laser chip 10, and T is temperature. For example, the protection cover 20 can suitably be formed of aluminum, which has the linear expansion coefficient equal to $2.3(\times 10^{-5}/K)$. It is also possible to use other appropriate metals, alloy, resin, or resin mixed with glass fibers, which satisfy the above-mentioned condition.

Figure 2:
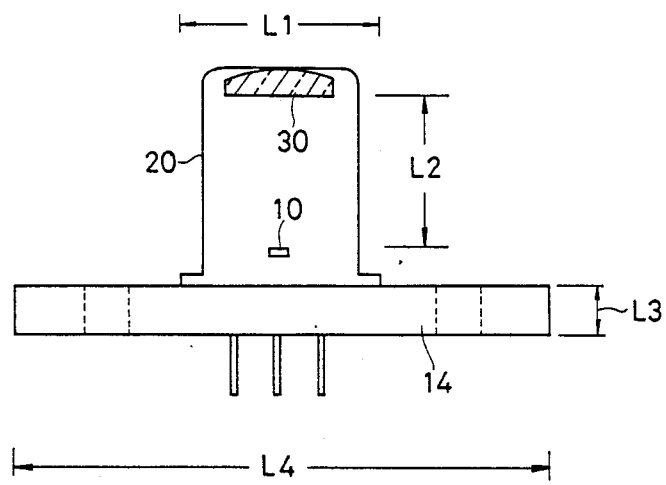
FIG. 2 is a side view of the embodiment of FIG. 1.

FIG. 2 is a side view of the embodiment of FIG. 1. A length L1 is the diameter of the protection cover 20, and is set equal to approximately 14 mm, for example. A length L2 is the back focal distance of the glass collimating lens 30, and is set equal to approximately 10 mm, for example. A length L3 is the thickness of the heat sink 14, and is set equal to approximately 4 mm. A length L4 is the width of the heat sink 14, and is set equal to approximately 40 mm. One may understand, from the above-mentioned dimensions, the real size of the semiconductor laser source unit of the present invention.

A description is given of four examples of the structure for the glass collimating lens 30 with reference to FIGS. 3, 5, 7 and 9. Each of the four examples of the glass collimating lens 30 has the primary function of collimating the laser beam emitted forward from the semiconductor laser chip 10. The first and second examples relate to cases where a glass cover is provided so as to cover the window 22 formed in the lid portion 20b of the protection cover 20. A single aspherical lens is fastened to a surface of the glass cover opposite to a surface thereof facing the semiconductor laser chip 10. Therefore, the first and second embodiments are designed taking into consideration the presence of the glass cover. The third and fourth examples relate to cases where the collimating lens 30 consists of only a single aspherical lens, or in other words, a single aspherical lens is also served as a glass cover.

In each of FIGS. 3, 5, 7 and 9, Ri (i=1, 2, 3, 4) is a radius of curvature. R1 is the radius of curvature of a lens surface of a single aspherical lens from which a collimated later beam is externally emitted. R2 is the radius of curvature of a lens surface of the single aspherical lens opposite to the semiconductor laser chip 10. In the first and second examples, R3 and R4 are radii of curvature of lens surfaces of a glass cover. Di (i=1, 2) is a thickness on the optical axis. D1 is the thickness of the single aspherical lens. D2 in the first and second embodiments is the thickness of the glass cover. Nj (j=1, 2) is a refractive index. N1 is the refractive index of the single aspherical lens where it is made of glass. N2 in the first and second embodiments is the refractive index of the glass cover.

In tables described below, BF is the back focus. In the first and second embodiments, the back focus BF corresponds to the distance between the lens surface of the single aspherical lens to which the glass cover is fastened, and the position of the semiconductor laser chip 10. In the third and fourth embodiments, the back focus BF is the distance between the lens surface of the single aspherical lens facing the semiconductor laser chip 10 and the position of the semiconductor laser chip 10.

An aspherical surface of a single aspherical lens is represented by the following known formula:

$$X = \{CY^2/[1 + \sqrt{1 - (1 + k)C^2Y^2}\,]\} + A2Y^2 + A4Y^4 \ldots$$

where X is the distance between a point on the aspherical lens surface and the tangential plane for the vervex of an aspherical lens surface, Y is the height from the optical axis of the lens, C is the radius of curvature, and k is the cone factor. In each of the first to fourth examples, aspherical lens surfaces are identified by aspherical surface coefficients, namely, the cone factor k and the high-order coefficients A2 and A4. In each of the first to fourth examples, the wavelength of the laser beam emitted from the semiconductor laser chip 10 is 780 nm.

EXAMPLE 1

The first example of the glass collimating lens 30 is illustrated in FIG. 3. In the first embodiment, the surface related to the radius of curvature R1 is an aspherical lens.

TABLE I

| i | Ri | Di | j | Nj |
|---|---|---|---|---|
| 1 | 6.270800 | 2.958200 | 1 | 1.57221 |
| 2 | −54.054390 | 0.0 | | |
| 3 | ∞ | 0.2500 | 2 | 1.51118 |
| 4 | ∞ | | | |

(where f = 10 mm, NA = 0.25, and BF = 8.116138)

TABLE II

| i | k | A2 | A4 |
|---|---|---|---|
| 1 | −0.679826 | 0.0 | $-2.140202 \times 10^{-5}$ |

FIG. 4A illustrates a spherical aberration SA and a sine condition SC of the first example. FIG. 4B and 4C illustrate an aspherical aberration DS, DM, and a distortion aberration DIST, respectively. FIG. 4D illustrates a comatic aberration COMA. It can be seen from FIGS. 4A through 4D that the first example exhibits good optical characteristics.

The second example of the glass collimating lens 30 is illustrated in FIG. 5. Opposed lens surfaces of the second example related to radii of curvature R1 and R2 are aspherical surfaces.

TABLE III

| i | Ri | Di | j | Nj |
|---|---|---|---|---|
| 1 | 6.269000 | 2.973090 | 1 | 1.57221 |
| 2 | −54.269980 | 0.0 | | |
| 3 | ∞ | 0.2500 | 2 | 1.51118 |
| 4 | ∞ | | | |

(where f = 10 mm, NA = 0.25, and BF = 8.108513)

TABLE IV

| i | k | A2 | A4 |
|---|---|---|---|
| 1 | −0.679826 | 0.0 | $-1.799174 \times 10^{-5}$ |
| 2 | −2.671982 | 0.0 | $3.225297 \times 10^{-6}$ |

FIG. 6A illustrates a spherical aberration SA and a sine condition SC of the second example. FIG. 6B and 6C illustrate an aspherical aberration DS, DM, and a distortion aberration DIST, respectively. FIG. 6D illustrates a comatic aberration COMA. It can be seen from FIGS. 6A through 6D that the second example exhibits good optical characteristics.

The third example of the glass collimating lens 30 is illustrated in FIG. 7. Opposed lens surfaces of the second example related to radii of curvature R1 and R2 are aspherical surfaces.

TABLE V

| i | Ri | Di | j | Nj |
|---|---|---|---|---|
| 1 | 6.894300 | 1.5000 | 1 | 1.7661 |
| 2 | 62.419300 | | | |

(where f = 10 mm, NA = 0.25, and BF = 9.0563)

TABLE VI

| i | k | A2 | A4 |
|---|---|---|---|
| 1 | −0.5896 | 0.0 | $2.5875 \times 10^{-5}$ |

TABLE VI-continued

| i | k | A2 | A4 |
|---|---|---|---|
| 2 | −11.2291 | 0.0 | $-3.8610 \times 10^{-6}$ |

Figure 8E:
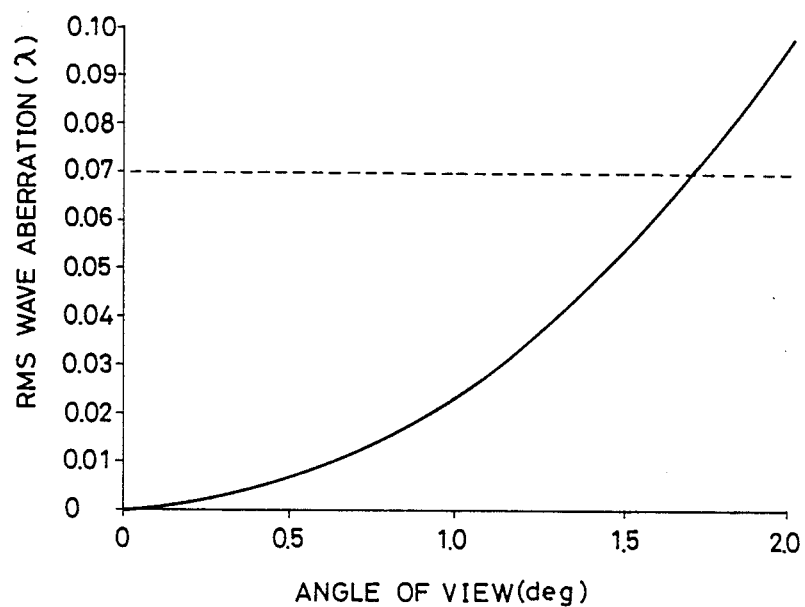

FIG. 8A illustrates a spherical aberration SA and a sine condition SC of the third example. FIG. 8B and 8C illustrate an aspherical aberration DS, DM, and a distortion aberration DIST, respectively. FIG. 8D illustrates a comatic aberration COMA. FIG. 8E illustrates an RMS wave aberration as a function of an angle of view. It can be seen from FIGS. 8A through 8E that the third example exhibits good optical characteristics.

Figure 9:
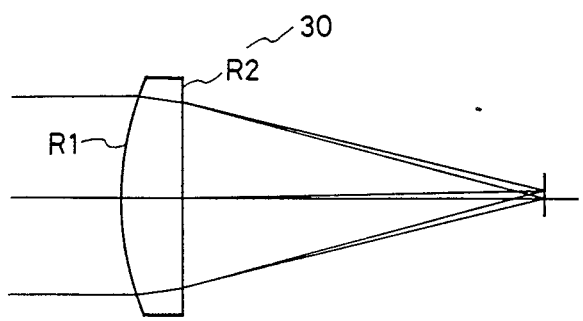
FIG. 9 is a view of a fourth example of the glass collimating lens used in the embodiment.

The fourth example of the glass collimating lens 30 is illustrated in FIG. 9. A lens surface related to the radius of curvature R1 is an aspherical surface.

TABLE VII

| i | Ri | Di | j | Nj |
|---|---|---|---|---|
| 1 | 6.887400 | 1.5000 | 1 | 1.7661 |
| 2 | 61.805900 | | | |

(where f = 10 mm, NA = 0.25, and BF = 9.0553)

TABLE VIII

| i | k | A2 | A4 |
|---|---|---|---|
| 1 | −0.5448 | 0.0 | $1.5864 \times 10^{-5}$ |

FIG. 10A illustrates a spherical aberration SA and a sine condition SC of the fourth example. FIG. 10B and 10C illustrate an aspherical aberration DS, DM, and a distortion aberration DIS, respectively. FIG. 10D illustrates a comatic aberration COMA. FIG. 10E illustrates an RMS wave aberration as a function of an angle of view. It can be seen from FIGS. 8A through 8E that the fourth example exhibits good optical characteristics.

The RMS wave aberration as a function of angle of view for each of the third and fourth examples represents that a wide angle of view is available. This results from the use of a single aspherical lens surface, which is closed to the semiconductor laser chip 10. Although not illustrating the RMS waver aberration characteristics for the first and second examples, it has been confirmed that the angle of view is wide. It is noted that a wide angle of view means a large degree of allowable wave aberration with respect to inclination of lens. Thereby, it becomes possible to make positional precision of the glass collimating lens 30 less severe.

According to the present invention, it becomes possible to construct a semiconductor laser source unit by using only a semiconductor laser unit capable of a collimated laser beam. It is noted that the semiconductor laser unit used in the semiconductor laser source unit disclosed in U.S. Pat. No. 4,763,334 emits a divergent laser beam and therefore a collimating lens must be arranged separately from the semiconductor laser unit.

As described previously, it is preferable that the aspherical lens is formed of glass. This is because a glass aspherical lens is hardly affected by temperature.

The present invention is not limited to the embodiments, and variations and modifications may be made without departing from the scope of the present invention.

What is claimed is:

1. A semiconductor laser source unit comprising:
a semiconductor laser chip emitting a laser beam;

a base member supporting said semiconductor laser chip;

a protection cover mounted on said base member so as to cover said semiconductor laser chip, said protection cover having a lid portion formed at an end thereof opposite said base member and a window formed in said lid and facing said laser chip; and a single aspherical lens fastened to the lid portion of said protection cover so as to cover said window formed in said lid portion, said single aspherical lens collimating said laser beam emitted from semiconductor laser chip, and said single aspherical lens including an aspherical lens surface having a characteristic represented by the following formula:

$$X = CY^2/[1 + \sqrt{1 - (1 + k)C^2Y^2)} + A2Y^2 + A4Y^4 \ldots ]$$

where X is a distance between a point on said aspherical lens surface and a tangential plane at a vertex of said aspherical lens surface, Y is a height from an optical axis of said aspherical lens, C is a radius of curvature at said vertex, k is a cone factor, and A2, A4 are coefficients.

2. A semiconductor laser source unit as claimed in claim 1, wherein said single aspherical lens is positioned so that the center thereof coincides with the optical axis of the laser beam emitted from said semiconductor laser chip.

3. A semiconductor laser source unit as claimed in claim 1, wherein said aspherical lens surface is exposed outside.

4. A semiconductor laser source unit as claimed in claim 1, wherein said single aspherical lens has an additional aspherical lens surface confronting said semiconductor laser chip.

5. A semiconductor laser source unit as claimed in claim 4, wherein the radius of curvature of said additional aspherical lens surface is larger than that of said aspherical lens surface.

6. A semiconductor laser source unit as claimed in claim 1, wherein said single aspherical lens is formed of glass.

7. A semiconductor laser source unit as claimed in claim 1, wherein said protection cover is formed of a material having a value $\alpha$ of the linear expansion coefficient so as to cancel a variation in the focal distance of said single aspherical lens by an expansion or contraction of said material of said protection cover, and wherein a material of the protection cover is selected so as to select the value $\alpha$ of the linear expansion coefficient so as to make the following formula zero:

$$\alpha - [(1/f)(d/80/dT) (df/fd\lambda)]$$

where f is a focal distance of said aspherical lens, $\lambda$ is a wavelength of a laser beam emitted from said semiconductor laser chip, and T is temperature.

8. A semiconductor laser source unit as claimed in claim 1, wherein said protection cover is formed of aluminum.

9. A semiconductor laser source unit as claimed in claim 1, wherein said single aspherical lens is fastened to the lid portion of said protection cover by an adhesive.

10. A semiconductor laser source unit as claimed in claim 1, wherein said protection cover is a member in the form of a hollow cylinder.

11. A semiconductor laser source unit as claimed in claim 1, wherein said base member comprises a first member supporting said semiconductor laser chip so that the laser beam emitted therefrom goes toward said single aspherical lens, a second member supporting said first supporting member, and a third supporting member supporting said protection cover and said second member.

12. A semiconductor laser source unit as claimed in claim 11, wherein said third member of said base member includes a projection portion extending elevationally therefrom, and said protection cover is fastened to said third member by press-fitting said projection portion of said third member into the opening of said protection cover.

13. A semiconductor laser source unit as claimed in claim 12, wherein said projection portion of said third member is a ring-shaped projection, and the opening of said protection cover is a circular opening.

14. A semiconductor laser source unit as claimed in claim 12, wherein said third member having an opening surrounded by said projection, and said second member of said base member is fastened to said third member so as to be press-fitted into said opening formed in the third member.

15. A semiconductor laser source unit as claimed in claim 14, wherein said opening of the third member is a circular opening, and said second member is a disc-shaped member.

16. A semiconductor laser source unit as claimed in claim 11, wherein said third member is a heat sink.

17. A semiconductor laser source unit as claimed in claim 1, wherein said semiconductor laser chip emits the laser beam including a first laser beam emitted therefrom forward, and a second laser beam emitted therefrom backward, and said first beam goes toward said single aspherical lens.

18. A semiconductor laser source unit as claimed in claim 17, further comprising a photoelectric conversion element fastened to said base member so as to receive said second laser beam emitted backward from said semiconductor laser chip.

19. A semiconductor laser source unit as claimed in claim 18, further comprising first, second and third terminals fastened to said base member and projecting outward therefrom, wherein said first terminal is coupled to said semiconductor laser chip, said second terminal is coupled to said photoelectric conversion element, and said third terminal is coupled to both the semiconductor laser chip and the photoelectric conversion element and is used as a common electrode.

20. A semiconductor laser source unit as claimed in claim 1, further comprising a glass cover fastened to said single aspherical lens.

21. A semiconductor laser source unit as claimed in claim 20, wherein said glass cover is fastened to a lens surface of said single aspherical lens opposite to said semiconductor laser chip.

22. A semiconductor laser source unit as claimed in claim 1, wherein said semiconductor laser chip emits two or more separated laser beams.

23. A semiconductor laser source unit as claimed in claim 1, wherein said protection cover has a flange portion formed around said end having said opening, and said flange portion makes contact with said base member.

* * * * *